(12) United States Patent
Sokolov et al.

(10) Patent No.: US 8,842,784 B2
(45) Date of Patent: Sep. 23, 2014

(54) L-VALUE GENERATION IN A DECODER (75) Inventors: Andrey P. Sokolov, Moscow (RU); Pavel A. Panteleev, Moscow (RU); Elyar E. Gasanov, Moscow (RU); Ilya V. Neznanov, Moscow (RU); Yurii S. Shutkin, Moscow (RU)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 549 days.

(21) Appl. No.: 13/115,359

(22) Filed: May 25, 2011

(65) Prior Publication Data

US 2012/0128102 A1    May 24, 2012

(30) Foreign Application Priority Data

Nov. 24, 2010 (RU) ................................. 2010147729

(51) Int. Cl.
H03M 13/03    (2006.01)
H03M 13/00    (2006.01)
H03M 13/39    (2006.01)
H03M 13/29    (2006.01)

(52) U.S. Cl.
CPC ........ H03M 13/296 (2013.01); H03M 13/6544 (2013.01); H03M 13/3988 (2013.01); H03M 13/6525 (2013.01); H03M 13/3927 (2013.01)
USPC .......................................... 375/341; 375/265

(58) Field of Classification Search
USPC .......... 375/265, 340, 341; 714/752, 784, 786, 714/792, 796
See application file for complete search history.

(56) References Cited

U.S. PATENT DOCUMENTS

2009/0319862 A1* 12/2009 Nguyen ........................ 714/752
2011/0066913 A1* 3/2011 Kang et al. ................... 714/752

OTHER PUBLICATIONS

Yuping Zhang Parhi, K.K., "High-Throughput Radix-4 logMAP Turbo Decoder Architecture", IEEE Xplore Digital Library, Publication Date Oct. 29, 2006, 1 page.
Seok-Jun Lee, et al., "Area-efficient high-throughput MAP decoder architectures", IEEE Xplore Digital Library, Publication Date Aug. 2005, 1 page.

* cited by examiner

*Primary Examiner* — David B. Lugo
(74) *Attorney, Agent, or Firm* — Christopher P. Maiorana, PC (57) ABSTRACT An apparatus having a first circuit, a second circuit and a third circuit is disclosed. The first circuit may be configured to generate a plurality of load values corresponding to a trellis of a decoding process. The second circuit generally includes a plurality of calculation layers. The calculation layers may be configured to generate a plurality of maximum values in response to the load values. The third circuit may be configured to generate a plurality of L-values of the decoding process in response to the maximum values.

18 Claims, 5 Drawing Sheets

L-VALUE GENERATION IN A DECODER

This application claims the benefit of Russian Application No. 2010147729, filed Nov. 24, 2010 and is hereby incorporated by reference in its entirety.

FIELD OF THE INVENTION

The present invention relates to digital decoding generally and, more particularly, to a method and/or apparatus for implementing L-value generation in a decoder.

BACKGROUND OF THE INVENTION

To compute L-values for a Long Term Evolution (LTE) standard according to widely used radix-2 modification of a Maximum A Posteriori (MAP) process, 28 "MAX2" operations are utilized. Each MAX2 operation calculates a maximum of two arguments. Thus, a trivial case scheme that computes L-values for the radix-2 MAP process has 28 independent MAX2 operations. Usage of a radix-4 modification of the MAP process doubles decoding speed and doubles the number of MAX2 operations. Moreover, computation of L-values for a Worldwide Interoperability for Microwave Access (WiMAX) standard significantly differs from a typical case which takes place in the LTE standard, a Wideband-CDMA (WCDMA) standard and a Code Division Multiple Access 2000 (CDMA2000) standard. Therefore, trivial schemes for multi-standard L-value calculations would have many MAX2 operations and occupy large areas in silicon.

SUMMARY OF THE INVENTION

The present invention concerns an apparatus having a first circuit, a second circuit and a third circuit. The first circuit may be configured to generate a plurality of load values corresponding to a trellis of a decoding process. The second circuit generally includes a plurality of calculation layers. The calculation layers may be configured to generate a plurality of maximum values in response to the load values. The third circuit may be configured to generate a plurality of L-values of the decoding process in response to the maximum values.

The objects, features and advantages of the present invention include providing a method and/or apparatus for implementing L-value generation in a decoder that may (i) utilize a network of computation layers having only MAX2 circuits, (ii) utilize a low total number of MAX2 circuits in the network, (iii) operate in radix-4 modified MAP decoding processes, (iv) support multiple communications standards that use turbo codes and/or (v) have a silicon area comparable with small radix-2 single-standard solutions.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Some embodiments of the present invention generally provide a low silicon area scheme for high speed computation of Log-Likelihood Ratio (LLR) values, also called L-values, for multiple wireless communications standards. L-values may have positive values when corresponding bits are likely logical ones and negative values when the corresponding bits are likely logical zeros. The wireless communications standards may include, but are not limited to, a Long Term Evolution (LTE) standard (3GPP Release 8), an Institute of Electrical and Electronics Engineering (IEEE) 802.16 standard (WIMAX), a Wideband-CDMA/High Speed Packet Access (WCDMA/HSPA) standard (3GPP Release 7) and a CDMA-2000/Ultra Mobile Broadband (UMB) standard (3GPP2). Other wired and/or wireless communications standards may be implemented to meet the criteria of a particular application.

Computation of the L-values may form an internal operation of a Maximum A Posteriori (MAP) decoding process that is used for decoding turbo codes. Such turbo codes may be used in many modern wireless communications standards. The MAP decoding process is generally organized such that computation of the L-values impacts a circuit design in terms of layout area. Moreover, some features of the emerging standard WiMAX may cause calculation of the L-value to occupy even more area.

Some embodiments of the present invention may simultaneously support many or all types of turbo codes used in modern wireless communications standards, including WiMAX. The scheme generally accommodates low area and high throughput designs and may contain a net of maximum (MAX2) modules with a specific structure. The structure feature generally makes possible a recognizable imprint of the design.

Figure 1:
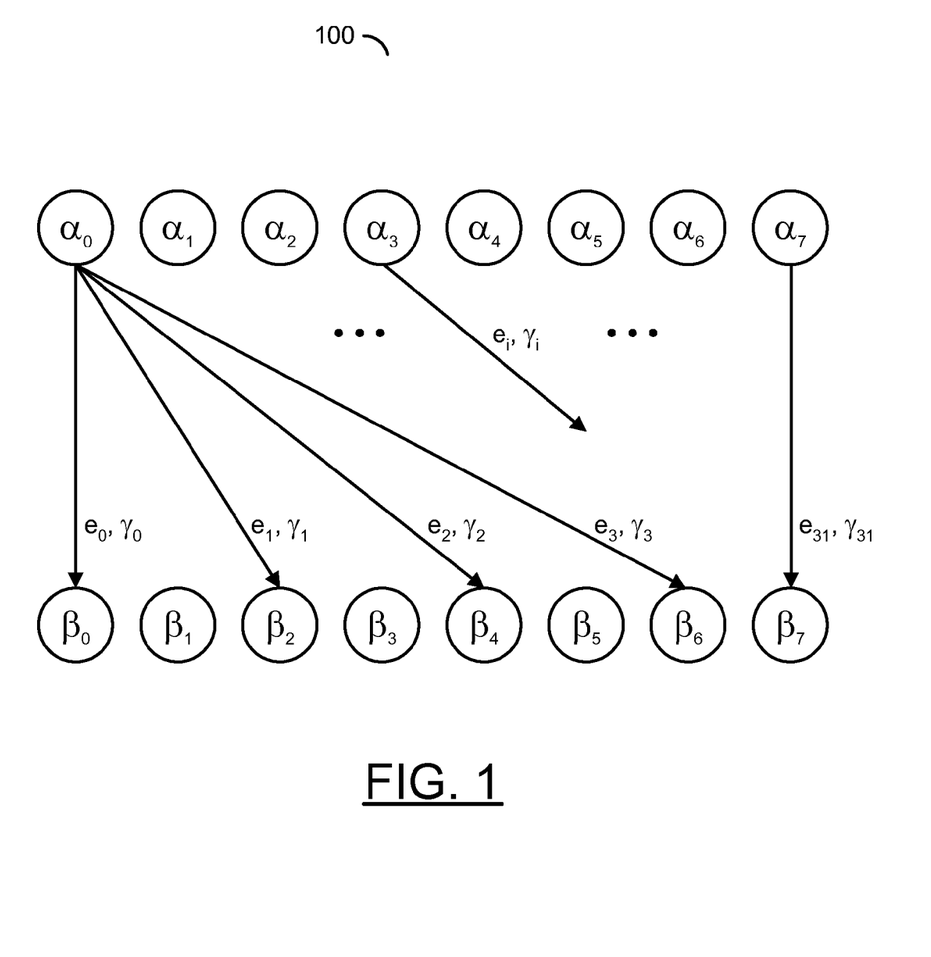
FIG. 1 is a simplified diagram of a single layer of a trellis graph.

Referring to FIG. 1, a simplified diagram of a single layer of a trellis graph 100 is shown. The trellis graph 100 may be suitable for use in a radix-4 modification of a MAP decoding processes. The trellis graph 100 may be used computing the L-values. All supported wireless communications standards generally use trellises with multiple (e.g., 8) vertices and multiple (e.g., 32) edges.

In the trellis graph 100, the values $\alpha_0, \ldots, \alpha_7$ and $\beta_0, \ldots, \beta_7$ may be called state metrics. The values $\gamma_0, \ldots, \beta_{31}$ may be called branch metrics. In addition to $\gamma$-values, each edge ei may also have four associated values: x0,x1,z0,z1. The values x0,x1 may stand for input bits of an encoder. Values z0,z1 may stand for output bits corresponding to the input bits. All of the values x0,x1,z0,z1 may comprise initial data for calculating the L-values.

Computing the L-values may depend on the communications standard being used. In case of LTE and WCDMA/HSPA standards, the calculations may be done according to formulae set 1 as follows:

$$L_0 = \max_{e:x_0=1}(\alpha e + \beta e + \gamma e) - \max_{e:x_0=0}(\alpha e + \beta e + \gamma e) \quad (1)$$

$$L_1 = \max_{e:x_1=1}(\alpha e + \beta e + \gamma e) - \max_{e:x_1=0}(\alpha e + \beta e + \gamma e)$$

The expression $$\max_{e:x_i=a}(\alpha e + \beta e + \gamma e)$$

generally stands for a maximum of expressions $(\alpha e + \beta e + \gamma e)$ over all edges e where xi=a. The L-values $L_0$ and $L_1$ may be calculated using several (e.g., 4) different maximum operations.

In case of the WiMAX standard, three L-values may be computed instead of two. The three L-values may be generated according to formulae set 2 as follows:

$$L_{01} = \max_{e:x_0=0,x_1=1}(\alpha e + \beta e + \gamma e) - \max_{e:x_0=0,x_1=0}(\alpha e + \beta e + \gamma e) \quad (2)$$

$$L_{10} = \max_{e:x_0=1,x_1=0}(\alpha e + \beta e + \gamma e) - \max_{e:x_0=0,x_1=0}(\alpha e + \beta e + \gamma e)$$

$$L_{11} = \max_{e:x_0=1,x_1=1}(\alpha e + \beta e + \gamma e) - \max_{e:x_0=0,x_1=0}(\alpha e + \beta e + \gamma e)$$

The L-values $L_{01}$, $L_{10}$ and $L_{11}$ may be calculated using several (e.g., 4) different maximum operations.

From formulas set 2, a trivial multi-standard L-value computing scheme may calculate several (e.g., 8) different maximum operations. Four maximum operations may be used for the LTE and WCDMA/HSPA standards and four additional maximum operations for the WiMAX standard. Each maximum operation generally depends on multiple (e.g., 16) arguments. For high decoding speeds, the maximum operations may be completed in a single clock cycle due to specific characteristics of the MAP process. Therefore, 8 independent maximum modules may be included in the trivial scheme. To construct the 16 arguments, a total of 15 modules each computing the MAX2 (maximum of 2 arguments) operation may be utilized. In total, 120 of the MAX2 modules may compute the L-values in a single clock cycle. Correspondingly, the total area of the trivial L-calculation scheme may be large.

In addition to the L-values $L_0$, $L_1$, $L_{01}$, $L_{10}$ and $L_{11}$, a decoder may also compute several extrinsic L-values. For the LTE and/or WCDMA/HSPA standards, the extrinsic L-values may include $L_0^{ex}$ and $L_1^{ex}$. For the WiMAX standard, the extrinsic L-values generally include $L_{01}^{ex}$, $L_{10}^{ex}$ and $L_{11}^{ex}$. The extrinsic L-values may be used in a next decoding iteration. Extrinsic L-values are generally computed according to formulae set 3 as follows:

$$L_0^{ex} = L_0 - (sv(x_0) + L_0');$$

$$L_1^{ex} = L_1 - (sv(x_1) + L_1');$$

$$L_{01}^{ex} = L_{01} - (sv(x_2) + L_{01}');$$

$$L_{10}^{ex} = L_{10} - (sv(x_1) + L_{10}');$$

$$L_{11}^{ex} = L_{11} - (sv(x_1) + sv(x_2) + L_{11}'). \quad (3)$$

The values sv(xi) may stand for soft values of the xi bit coming from the communication channel. Values Li' may be extrinsic L-values coming from a previous decoding iteration.

Figure 2:
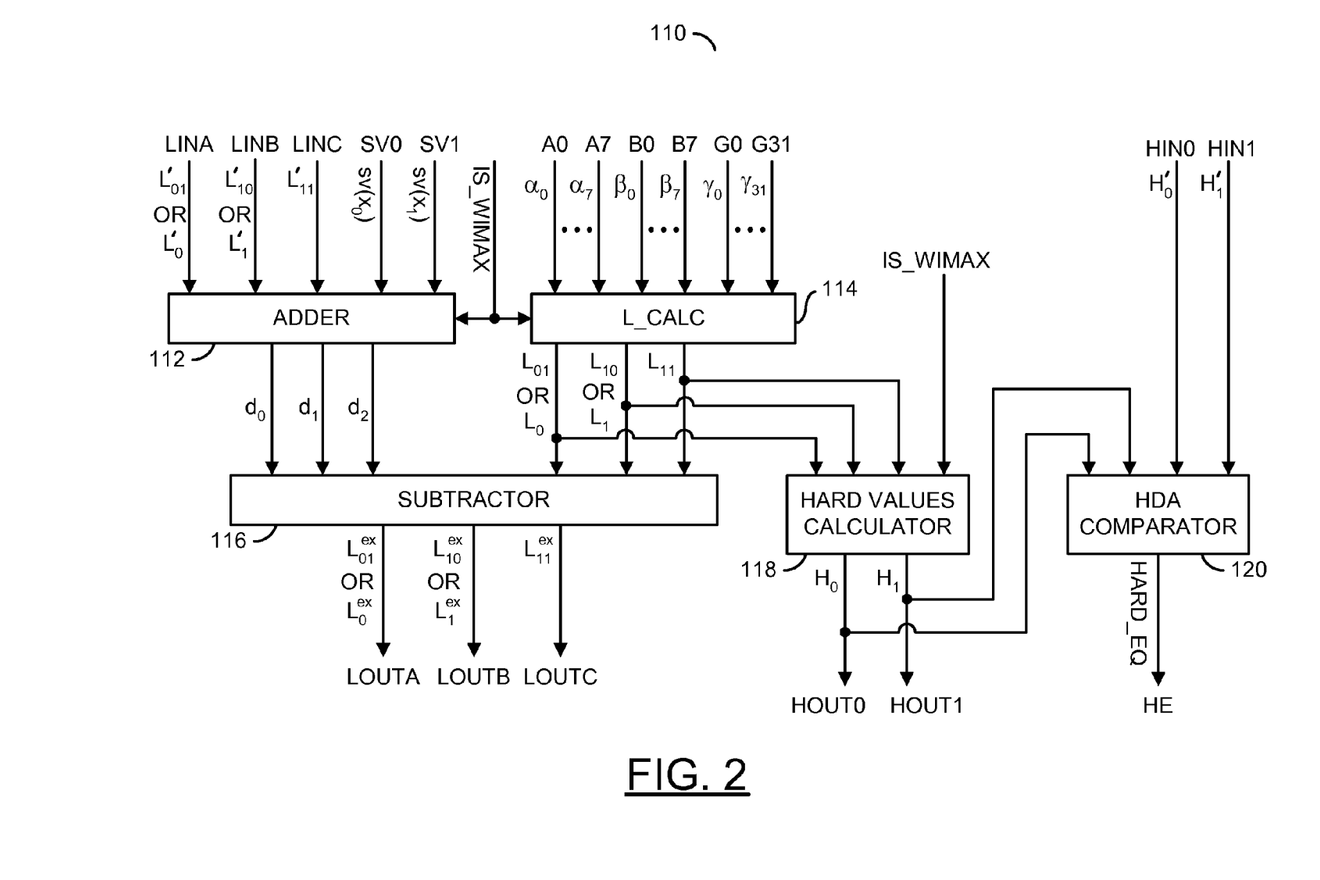
FIG. 2 is a block diagram of an apparatus in accordance with a preferred embodiment of the present invention.

Referring to FIG. 2, a block diagram of an apparatus 110 is shown in accordance with a preferred embodiment of the present invention. The apparatus (or device or circuit) 110 generally comprises a circuit (or module) 112, a circuit (or module) 114, a circuit (or module) 116, a circuit (or module) 118 and a circuit (or module) 120. The circuits 112 to 120 may represent modules and/or blocks that may be implemented as hardware, firmware, software, a combination of hardware, firmware and/or software, or other implementations. Apparatus 110 may implement a decoder.

A group of input signals (e.g., LINA, LINB and LINC) may be received by the circuit 112. Another group of input signals (e.g., SV0 and SV1) may also be received by the circuit 112. The circuit 114 may receive a set of input signals (e.g., A0 to A7 and B0 to B7). A configuration signal (e.g., IS_WIMAX) may be received by the circuits 112, 114 and 118. A set of output signals (e.g., LOUTA, LOUTB and LOUTC) may be generated by the circuit 116. The circuit 118 may generate a pair of output signals (e.g., HOUT0 and HOUT1). A set of input signals (e.g., HIN0 and HIN1) may be received by the circuit 120. The circuit 120 may generate an output signal (e.g., HE).

A scheme of the apparatus 110 may optimize usage of the MAX2 operations. The apparatus 110 may benefit from 8 maximums of 16 arguments using only 32 independent arguments. Having only 32 independent arguments to consider may be used to reduce the number of MAX2 operations implemented in the apparatus 110.

Some input signals of the apparatus 110 may carry different values depending on the particular communications standard being applied. For instance, the signals LINA, LINB and LINC may carry respective extrinsic previous iteration L-value $L_{01}'$, $L_{10}'$ and $L_{11}'$ while the apparatus 110 is configured for the WiMAX standard. The signals LINA and LINE may carry respective extrinsic previous iteration L-values $L_0'$ and $L_1'$ while the apparatus 110 is configured for either the LTE standard or the WCDMA standard. The signal LINC may not be used with the LTE or WCDMA standards.

Other input signals may carry the same type of data for all of the communications standard. The signals A0 to A7 and B0 to B7 may convey respective state metrics values $\alpha_0, \ldots, \alpha_7$ and $\beta_0, \ldots, \beta_7$. The signals G0 to G21 may carry the respective branch metric values $\gamma_0, \ldots, \gamma_{31}$. Signals HIN0 and HIN1 may bring previous iteration decoded hard values $H_0'$ and $H_1'$ for all communications standards. The signal IS_WIMAX may be used to configure the apparatus 110 between two decoding configurations. While the signal IS_WIMAX is deasserted (e.g., false), the apparatus 110 may be configured for decoding according to the LTE or WCDMA standards. While the signal IS_WIMAX is asserted (e.g., true), the apparatus 110 may be configured for decoding according to the WiMAX standard.

Some output signals of the apparatus 110 may also carry different values depending on the particular communications standard being applied. For instance, the signals LOUTA, LOUTB and LOUTC may carry respective extrinsic L-value $L_{01}^{ex}$, $L_{10}^{ex}$ and $L_{11}^{ex}$ while the apparatus 110 is configured for the WiMAX standard. The signals LOUTA and LOUTB may carry respective extrinsic L-values $L0^{ex}$ and $L_1^{ex}$ while the apparatus 110 is configured for either the LTE standard or the WCDMA standard. The signal LOUTC may not be used with the LTE or WCDMA standards.

Other output signals may carry the same type of data for all of the communications standard. The HOUT0 and HOUT1 may convey decoded hard values $H_0$ and $H_1$ for all communications standards. The signal HE may carry a value (e.g., HARD_EQ) in all configurations.

Some inter-circuit signals may carry different values depending on the configuration. The circuit 114 may generate and present the L-values $L_{01}$, $L_{10}$ and $L_{11}$ to both the circuits 116 and 118 in the WiMAX configuration. In the LTE/WCDMA configuration, the circuit 114 may generate and present the L-values $L_0$ and $L_1$ to both the circuits 116 and 118. Calculation of hard decision values (e.g., $H_0$ and $H_1$) may depend on the configuration. The signals HOUT0 and HOUT1 may be received by the circuit 120 from the circuit 118. The circuit 112 may calculate sum values (e.g., d0, d1 and d2) depending on the configuration. The values d0, d1 and d2 may be transferred from the circuit 112 to the circuit 116.

The circuit 112 may implement an adder circuit. The circuit 112 is generally operational to generate the values d0, d1 and d2 in response to the values received in the signals LINA, LINB, LINC, SV0 and SV1. Operation of the circuit 112 may depend on the configuration identified by the signal IS_WIMAX. Circuit 112 may be implemented by a standard adder design.

The circuit 114 may implement an L-value calculation circuit. The circuit 114 is generally operational to calculate (i) the values $L_0$ and $L_1$ or (ii) the values $L_{01}$, $L_{10}$ and $L_{11}$ in response to the state metrics values $\alpha_0, \ldots, \alpha_7$ and $\beta_0, \ldots, \beta_7$ and the branch metric values $\gamma_0, \ldots, \gamma_{31}$. Operation of the circuit 114 may depend on the configuration identified by the signal IS_WIMAX.

The circuit 116 generally implements a subtractor circuit. Circuit 116 may be operational to generate the signals LOUTA, LOUTB and LOUTC in response to (i) the values d0, d1 and d2 received from the circuit 112 and (ii) the L-values received from the circuit 114. Circuit 116 may be implemented by a standard subtractor design.

The circuit 118 may implement a hard values calculator. The circuit 118 is generally operational to calculate decoded hard values $H_0$, $H_1$ in response to the L-values received from the circuit 114. Output bits $H_0$, $H_1$ generally stand for decoded hard values of bits x0,x1. Calculation of the decoded hard values may depend on the configuration. Circuit 118 may be implemented by a standard design.

The circuit 120 generally implements a Hard Decision Aided (HDA) comparator circuit. The circuit 120 may be operational to evaluate stopping criterion that determines if the decoding process should stop or continue. Input bits $H_0'$, $H_1'$ may stand for decoded hard values of bits x0,x1 on the previous iteration. If two sequential iterations provide the same hard values, the circuit 120 may assert the signal HE (e.g., output flag HARD_EQ=true) to stop the decoding. Otherwise, the signal HE may be deasserted (e.g., HARD_EQ=false).

Figure 3:
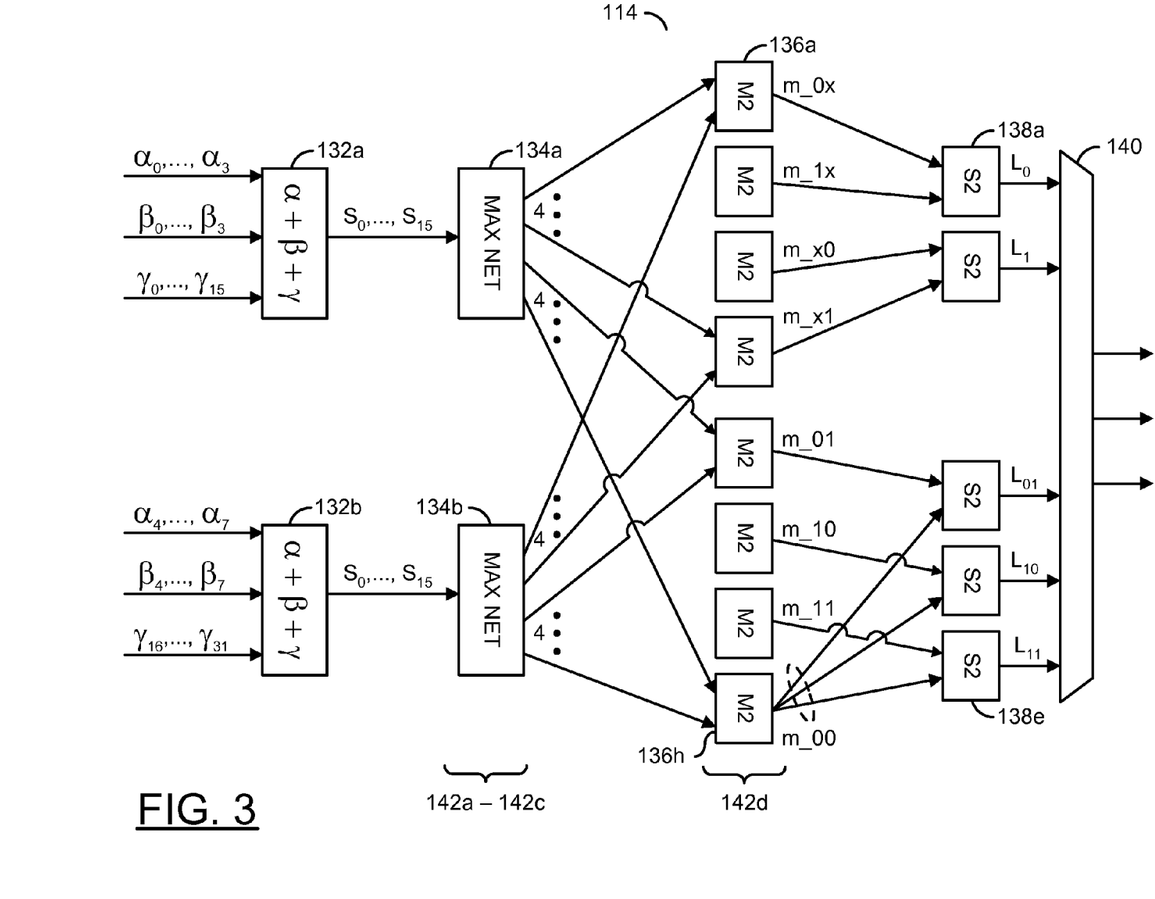
FIG. 3 is a detailed block diagram of an L-value calculation circuit.

Referring to FIG. 3, a detailed block diagram of the circuit 114 is shown. The circuit 114 may comprise multiple circuits (or module) 132a to 132b, multiple circuits (or modules) 134a to 134b, multiple circuits (or modules) 136a to 136h, multiple circuits (or modules) 138a to 138e and a circuit (or module) 140. The circuits 134a and 134b may represent multiple (e.g., 3) layers 142a to 142c of MAX2 operations. The circuits 136a to 136h may represent another layer 142d of MAX2 operations. The circuits 132a to 140 may represent modules and/or blocks that may be implemented as hardware, firmware, software, a combination of hardware, firmware and/or software, or other implementations.

The state metrics α and B and the branch metrics γ may be arranged in two similar parts and processed independently. A portion (e.g., initial half) of the state metrics and branch metrics may be received by the circuit 132a. The remaining portion (e.g., final half) of the state metrics and branch metrics may be received by the circuit 132b.

Each circuit 132a and 132b may implement a calculation circuit. Circuits 132a and 132b are generally operational to compute load values (e.g., s0, . . . , s15) of edges of the trellis layer. Load values s0, . . . , s15 calculated by the circuit 132a may be transferred to the circuit 134a. Load values s0, . . . , s15 calculated by the circuit 132b may be transferred to the circuit 134b.

Each circuit 134a and 134b may implement a maximum net circuit. Circuits 134a and 134b are generally operational to calculate maximum inside half edge values of trellis graph 100. The 8 maximum values may be calculated for the L-values per formulae sets 1 and 2. Each individual result may be presented to two different circuits among the circuits 136a to 136h.

Each circuit 136a to 136h generally implements a MAX2 (sometimes shortened to M2) circuit. The circuits 136a to 136 may be operational to receive two arguments, each from a different one of the circuits 134a and 134b, and determine a maximum argument between the two received arguments. The circuits 136a to 136h generally calculate final values of the 8 maximum operations in the formulae sets 1 and 2. Maximum values (e.g., m_0x to $m\_11$) may be presented to the circuit 138a to 138e. Values named m_ab generally stand for a maximum over all edges of the trellis where x0=a and x1=b. If a or b matches x, the value of corresponding xi may not be defined for the maximum operation.

Each circuit 138a to 138e generally implements a subtraction circuit. Circuits 138a to 138e may each be operational to compute a subtraction value of two arguments received from the circuit 136a to 136h. The subtraction values may be the L-values $L_0$, $L_1$, $L_{01}$, $L_{10}$ and $L_{11}$ generated by the respective circuits 138a to 138e.

The circuit 140 generally implements a multiplexer circuit. The circuit 140 may be operational to multiplex the L-values based on the configuration information received in the signal IS_WIMAX. While the signal IS_WIMAX is true, the circuit 140 may route the L-values $L_{01}$, $L_{10}$ and $L_{11}$ to the circuits 116 and 118. While the signal IS_WIMAX is false, the circuit 140 may route the L-values $L_0$ and $L_1$ to the circuits 116 and 118.

Figure 4:
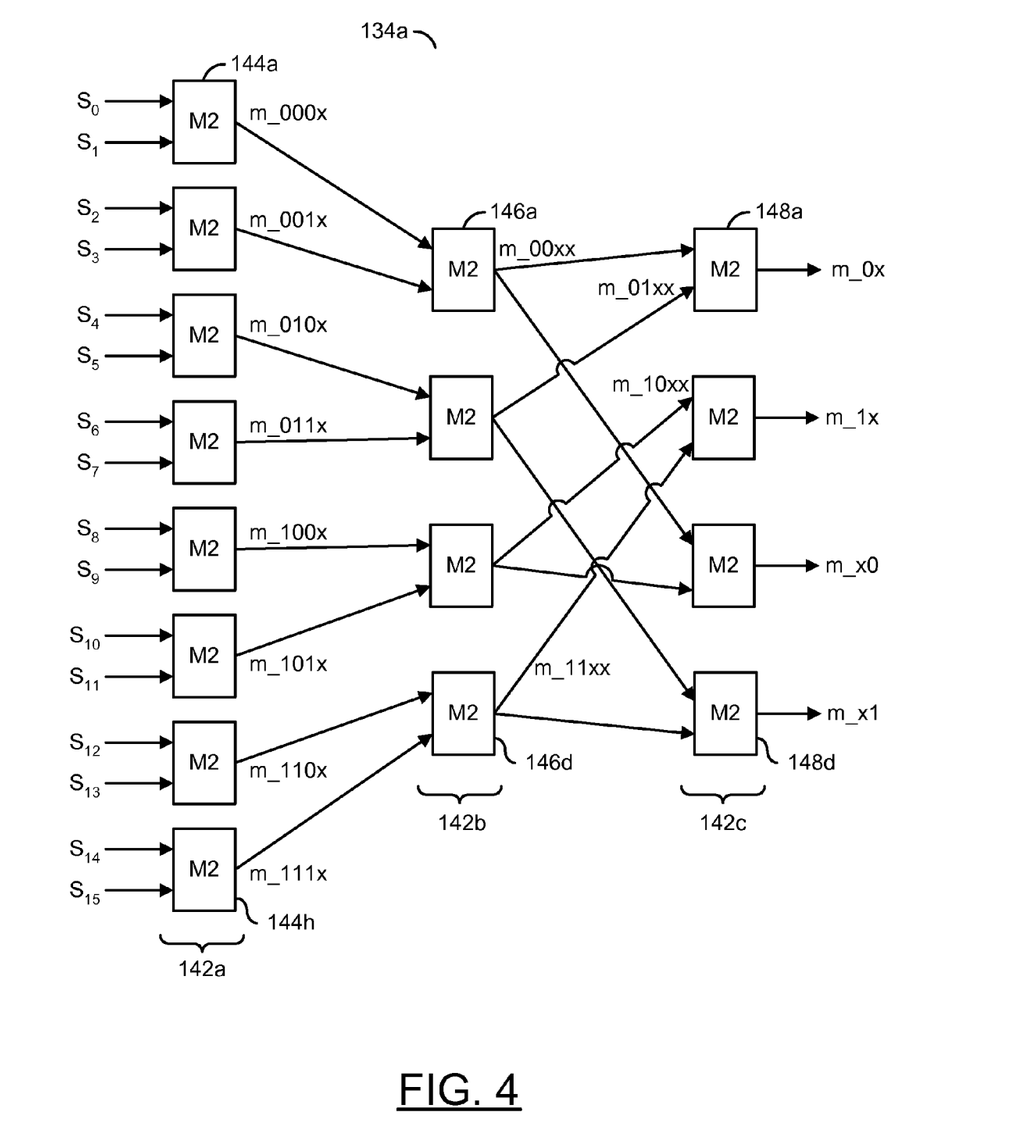
FIG. 4 is a detailed block diagram of a maximum net calculation circuit.

Referring to FIG. 4, a detailed block diagram of the circuit 134a is shown. The design of the circuit 134b may match the design of the circuit 134a. The circuit 134a generally comprises multiple circuits (or modules) 144a to 144h, multiple circuits (or modules) 146a to 146d and multiple circuits (or modules) 148a to 148d. The circuits 144a and 144h may represent the layer 142a. Circuits 146a to 146d may represent the layer 142b. The circuits 148a to 148d may represent the layer 142c. The circuits 144a to 148d may represent modules and/or blocks that may be implemented as hardware, firmware, software, a combination of hardware, firmware and/or software, or other implementations.

Each circuit 144a to 148d may implement a MAX2 circuit. Circuits 144a to 148d may be operational to receive two arguments and determine a maximum argument between the two received arguments. The circuits 144a to 144h in the layer 142a may receive the load values s0 to s15 and present maximum values (e.g., m_000x to m_111x). A value named m abed may stand for a maximum over all edges of the trellis where x0=a, x1=b, z0=c and z1=d. If a, b, c or d matches x, the value of corresponding xi or zi may not be defined for the maximum operation.

The circuits 146a to 146d in the layer 142b may receive the maximum values m_000x to $m\_111x$ from the layer 142a. The circuits 146a to 146d may be operational to calculate and present maximum values (e.g., m_00xx to m_11xx). The values named m_00xx to m_11xx may have the same definition given above for m_abcd.

The circuit 148a to 148d in the layer 142c may receive the maximum values m_00xx to m_xx from the layer 142b. The circuit 148a to 148d may be operational to calculate and present several maximum values (e.g., m_0x to $m\_x1$) to the circuits 136a to 136h in the layer 124d (FIG. 3). Values named m_ab generally stand for a maximum over all edges of the trellis where x0=a and x1=b. If a or b matches x, the value of corresponding xi may not be defined for the maximum operation (same as given above for the circuits 136a to 136h).

Figure 5:
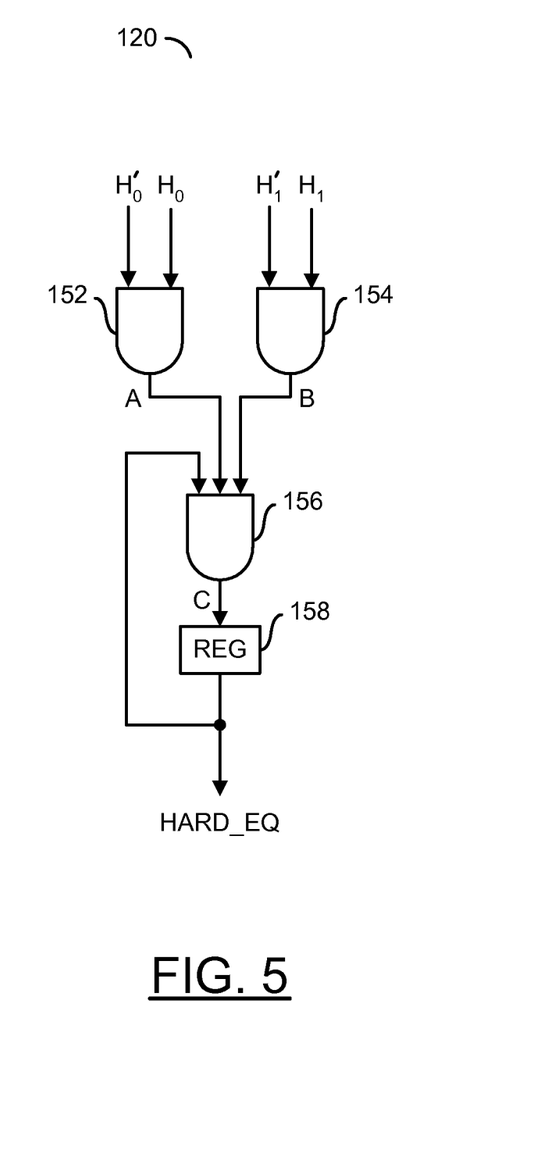
FIG. 5 is a detailed block diagram of a hard decision aided comparator circuit.

Referring to FIG. 5, a detailed block diagram of the circuit 120 is shown. The circuit 120 generally comprises a circuit (or module) 152, a circuit (or module) 154, a circuit (or module) 156 and a circuit (or module) 158. The circuits 152 to 158 may represent modules and/or blocks that may be implemented as hardware, firmware, software, a combination of hardware, firmware and/or software, or other implementations.

Each circuit 152, 154 and 156 may implement a Boolean logic circuit. Circuits 152 and 154 may operate as two-input AND gates. Circuit 156 may operate as a three-input AND gate. The circuit 152 may generate a value (e.g., A) from the values $H_0'$ and $H_0$. Circuit 154 may generate a value (e.g., B) from the values $H_1'$ and $H_1$. The circuit 156 may generate a value (e.g., C) from the value A, the value B and the value HARD_EQ.

The circuit 158 may implement a register circuit. Circuit 158 is generally operational to store the value C for one or more clock cycles. The circuit 158 may present the stored value as the value HARD_EQ. At the start of an iteration, the value HARD_EQ may be set to a logical one. If the hard values $H_0'$ and $H_1'$ from the previous iteration do not match the current hard values $H_0$ and $H_1$ respectively, the value HARD_EQ may become a logical zero until the end of the iteration. If the previous hard values $H_0'$ and $H_1'$ match the current hard values $H_0$ and $H_1$, the value HARD_EQ may remain at the logical one condition.

The functions performed by the diagrams of FIGS. 2 to 5 may be implemented using one or more of a conventional general purpose processor, digital computer, microprocessor, microcontroller, RISC (reduced instruction set computer) processor, CISC (complex instruction set computer) processor, SIMD (single instruction multiple data) processor, signal processor, central processing unit (CPU), arithmetic logic unit (ALU), video digital signal processor (VDSP) and/or similar computational machines, programmed according to the teachings of the present specification, as will be apparent to those skilled in the relevant art(s). Appropriate software, firmware, coding, routines, instructions, opcodes, microcode, and/or program modules may readily be prepared by skilled programmers based on the teachings of the present disclosure, as will also be apparent to those skilled in the relevant art(s). The software is generally executed from a medium or several media by one or more of the processors of the machine implementation.

The present invention may also be implemented by the preparation of ASICs (application specific integrated circuits), Platform ASICs, FPGAs (field programmable gate arrays), PLDs (programmable logic devices), CPLDs (complex programmable logic device), sea-of-gates, RFICs (radio frequency integrated circuits), ASSPs (application specific standard products), one or more monolithic integrated circuits, one or more chips or die arranged as flip-chip modules and/or multi-chip modules or by interconnecting an appropriate network of conventional component circuits, as is described herein, modifications of which will be readily apparent to those skilled in the art(s).

The present invention thus may also include a computer product which may be a storage medium or media and/or a transmission medium or media including instructions which may be used to program a machine to perform one or more processes or methods in accordance with the present invention. Execution of instructions contained in the computer product by the machine, along with operations of surrounding circuitry, may transform input data into one or more files on the storage medium and/or one or more output signals representative of a physical object or substance, such as an audio and/or visual depiction. The storage medium may include, but is not limited to, any type of disk including floppy disk, hard drive, magnetic disk, optical disk, CD-ROM, DVD and magneto-optical disks and circuits such as ROMs (read-only memories), RAMs (random access memories), EPROMs (electronically programmable ROMs), EEPROMs (electronically erasable ROMs), UVPROM (ultra-violet erasable ROMs), Flash memory, magnetic cards, optical cards, and/or any type of media suitable for storing electronic instructions.

The elements of the invention may form part or all of one or more devices, units, components, systems, machines and/or apparatuses. The devices may include, but are not limited to, servers, workstations, storage array controllers, storage systems, personal computers, laptop computers, notebook computers, palm computers, personal digital assistants, portable electronic devices, battery powered devices, set-top boxes, encoders, decoders, transcoders, compressors, decompressors, pre-processors, post-processors, transmitters, receivers, transceivers, cipher circuits, cellular telephones, digital cameras, positioning and/or navigation systems, medical equipment, heads-up displays, wireless devices, audio recording, storage and/or playback devices, video recording, storage and/or playback devices, game platforms, peripherals and/or multi-chip modules. Those skilled in the relevant art(s) would understand that the elements of the invention may be implemented in other types of devices to meet the criteria of a particular application.

As would be apparent to those skilled in the relevant art(s), the signals illustrated in FIGS. 2 to 5 represent logical data flows. The logical data flows are generally representative of physical data transferred between the respective blocks by, for example, address, data, and control signals and/or busses. The system represented by the circuit 100 may be implemented in hardware, software or a combination of hardware and software according to the teachings of the present disclosure, as would be apparent to those skilled in the relevant art(s). As used herein, the term "simultaneously" is meant to describe events that share some common time period but the term is not meant to be limited to events that begin at the same point in time, end at the same point in time, or have the same duration.

While the invention has been particularly shown and described with reference to the preferred embodiments thereof, it will be understood by those skilled in the art that various changes in form and details may be made without departing from the scope of the invention.

What is claimed is:

1. An apparatus comprising:
    a first circuit configured to generate a plurality of load values corresponding to a trellis of a decoding process;
    a second circuit comprising a plurality of calculation layers (i) connected in series and (ii) configured to generate a plurality of intermediate values in response to said load values, wherein an initial of said calculation layers in said second circuit is configured to calculate maximums of respective pairs of said load values;
    a third circuit having an additional one of said calculation layers configured to generate a plurality of maximum values by calculating maximums between respective pairs of said intermediate values; and
    a fourth circuit configured to generate a plurality of L-values of said decoding process in response to respective pairs of said maximum values.

2. The apparatus according to claim 1, wherein a depth of said calculation layers through said second circuit is at most three layers.

3. The apparatus according to claim 1, wherein (i) each of said calculation layers comprise a plurality of fifth circuits and (ii) each of said fifth circuits is configured to calculate a maximum of two arguments.

4. The apparatus according to claim 1, wherein said decoding process comprises a radix-4 version of a maximum a posteriori decoding process.

5. The apparatus according to claim 1, wherein a last of said calculation layers in said second circuit is configured to present all of said intermediate values to said third circuit.

6. The apparatus according to claim 1, wherein (i) a first of a plurality of communications standards utilizes a first set of said L-values in said decoding process and (ii) a second of said communications standards utilized a second set of said L-values in said decoding process.

7. The apparatus according to claim 6, wherein said fourth circuit is further configured to select between said first set of said L-values and said second set of said L-values in response to a configuration signal.

8. The apparatus according to claim 6, wherein said communications standards include at least two of (i) a Long Term Evolution (LTE) standard, (ii) an Institute of Electrical and Electronics Engineering (IEEE) 802.16 standard and (iii) a Wideband-CDMA/High Speed Packet Access (WCDMA/HSPA) standard.

9. The apparatus according to claim 1, wherein said apparatus is implemented as at least one integrated circuit.

10. A method for generating L-values, comprising the steps of:
(A) generating a plurality of load values corresponding to a trellis of a decoding process;
(B) generating a plurality of intermediate values in response to said load values using a plurality of calculation layers connected in series in a first circuit;
(C) calculating maximums of respective pairs of said load values using an initial of said calculation layers in said first circuit;
(D) generating a plurality of maximum values by calculating maximums between respective pairs of said intermediate values in an additional one of said calculation layers in a second circuit; and
(E) generating said L-values of said decoding process in response to respective pairs of said maximum values.

11. The method according to claim 10, wherein a depth of said calculation layers through said first circuit is at most three layers.

12. The method according to claim 10, wherein (i) each of said calculation layers comprise a plurality of third circuits and (ii) each of said third circuits is configured to calculate a maximum of two arguments.

13. The method according to claim 10, wherein said decoding process comprises a radix-4 version of a maximum a posteriori decoding process.

14. The method according to claim 10, further comprising the step of:
presenting all of said intermediate values to said second circuit from a last of said calculation layers in said first circuit.

15. The method according to claim 10, wherein (i) a first of a plurality of communications standards utilizes a first set of said L-values in said decoding process and (ii) a second of said communications standards utilized a second set of said L-values in said decoding process.

16. The method according to claim 15, further comprising the step of:
selecting between said first set of said L-values and said second set of said L-values in response to a configuration signal.

17. The method according to claim 15, wherein said communications standards include at least two of (i) a Long Term Evolution (LTE) standard, (ii) an Institute of Electrical and Electronics Engineering (IEEE) 802.16 standard and (iii) a Wideband-CDMA/High Speed Packet Access (WCDMA/HSPA) standard.

18. A method for generating L-values, comprising the steps of:
(A) generating a plurality of load values corresponding to a trellis of a decoding process;
(B) generating a plurality of intermediate values in response to said load values using a plurality of calculation layers connected in series in a first circuit;
(C) generating a plurality of maximum values by calculating maximums between respective pairs of said intermediate values in an additional one of said calculation layers in a second circuit, wherein (i) each of said calculation layers comprise a plurality of third circuits and (ii) each of said third circuits is configured to calculate a maximum of two arguments; and
(D) generating said L-values of said decoding process in response to respective pairs of said maximum values.

* * * * *